(12) United States Patent
Hirai et al.

(10) Patent No.: US 11,123,986 B2
(45) Date of Patent: Sep. 21, 2021

(54) LIQUID EJECTING HEAD, LIQUID EJECTING APPARATUS, AND PIEZOELECTRIC DEVICE

(71) Applicant: SEIKO EPSON CORPORATION, Tokyo (JP)

(72) Inventors: Eiju Hirai, Azumino (JP); Shiro Yazaki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 15 days.

(21) Appl. No.: 16/725,456

(22) Filed: Dec. 23, 2019

(65) Prior Publication Data

US 2020/0207092 A1 Jul. 2, 2020

(30) Foreign Application Priority Data

Dec. 26, 2018 (JP) .............................. JP2018-241978

(51) Int. Cl.
| | |
|---|---|
| *B41J 2/14* | (2006.01) |
| *H01L 41/09* | (2006.01) |
| *H01L 41/08* | (2006.01) |
| *H01L 41/047* | (2006.01) |

(52) U.S. Cl.
CPC ...... *B41J 2/14233* (2013.01); *H01L 41/0472* (2013.01); *H01L 41/0805* (2013.01); *H01L 41/09* (2013.01)

(58) Field of Classification Search
CPC ............... B41J 2/14233; B41J 2202/11; B41J 2002/14362; B41J 2002/14241; B41J 2/01; B41J 2002/14258; H01L 41/09; H01L 41/0805; H01L 41/0472; H01L 41/0973; H01L 41/047
See application file for complete search history.

(56) References Cited

U.S. PATENT DOCUMENTS

| | | | |
|---|---|---|---|
| 2008/0170107 A1* | 7/2008 | Li | ........................ H01L 41/0973 347/71 |
| 2016/0096368 A1* | 4/2016 | Yazaki | ................... B41J 2/1632 347/70 |
| 2017/0008288 A1 | 1/2017 | Yazaki | |
| 2018/0111373 A1 | 4/2018 | Yazaki | |

FOREIGN PATENT DOCUMENTS

JP        2016076525        5/2016

OTHER PUBLICATIONS

IP.com search (Year: 2021).*

* cited by examiner

*Primary Examiner* — Lisa Solomon
(74) *Attorney, Agent, or Firm* — Workman Nydegger

(57) ABSTRACT

A liquid ejecting head includes a diaphragm that constitutes a part of a wall surface of a pressure chamber in which a liquid is filled, and a piezoelectric element that vibrates the diaphragm, in which the piezoelectric element includes a first electrode and a second electrode, and a piezoelectric layer including a first portion located between the first electrode and the second electrode and a second portion not overlapping at least one of the first electrode and the second electrode in plan view, a first surface at an opposite side of the first portion from the diaphragm and a second surface at an opposite side of the second portion from the diaphragm are different in position in a laminate direction of the first electrode, the piezoelectric layer, and the second electrode, and a second film thickness of the second portion is larger than a first film thickness of the first portion.

13 Claims, 7 Drawing Sheets

LIQUID EJECTING HEAD, LIQUID EJECTING APPARATUS, AND PIEZOELECTRIC DEVICE

The present application is based on, and claims priority from JP Application Serial Number 2018-241978, filed Dec. 26, 2018, the disclosure of which is hereby incorporated by reference herein in its entirety.

BACKGROUND

1. Technical Field

The present disclosure relates to a liquid ejecting head, a liquid ejecting apparatus, and a piezoelectric device.

2. Related Art

A technique of ejecting a liquid in a pressure chamber from a nozzle using a piezoelectric element has been proposed in the related art. For example, as disclosed in JP-A-2016-76525, a piezoelectric element is configured by laminating a first electrode, a piezoelectric layer, and a second electrode.

The piezoelectric element includes a first portion located between the first electrode and the second electrode and a second portion that does not overlap the first electrode. The first portion is deformed in accordance with a voltage between the first electrode and the second electrode, whereas the second portion is not deformed in accordance with the voltage. Therefore, a stress is concentrated near a boundary between the first portion and the second portion, and the boundary may be damaged due to long-term use.

SUMMARY

According to an exemplary aspect of the present disclosure, there is provided a liquid ejecting head including a diaphragm that constitutes a part of a wall surface of a pressure chamber in which a liquid is filled, and a piezoelectric element that vibrates the diaphragm, in which the piezoelectric element includes a first electrode and a second electrode, and a piezoelectric layer including a first portion located between the first electrode and the second electrode and a second portion not overlapping at least one of the first electrode and the second electrode in plan view, a first surface at an opposite side of the first portion from the diaphragm and a second surface at an opposite side of the second portion from the diaphragm are different in position in a laminate direction of the first electrode, the piezoelectric layer, and the second electrode, and a second film thickness of the second portion is larger than a first film thickness of the first portion.

Further, according to another exemplary aspect of the present disclosure, there is provided a piezoelectric element including a diaphragm, and a piezoelectric element that vibrates the diaphragm, in which the piezoelectric element includes a first electrode and a second electrode, and a piezoelectric layer including a first portion located between the first electrode and the second electrode and a second portion not overlapping at least one of the first electrode and the second electrode in plan view, a first surface at an opposite side of the first portion from the diaphragm and a second surface at an opposite side of the second portion from the diaphragm are different in position in a laminate direction of the first electrode, the piezoelectric layer, and the second electrode, and a second film thickness of the second portion is larger than a first film thickness of the first portion.

DESCRIPTION OF EXEMPLARY EMBODIMENTS

First Embodiment

Figure 1:
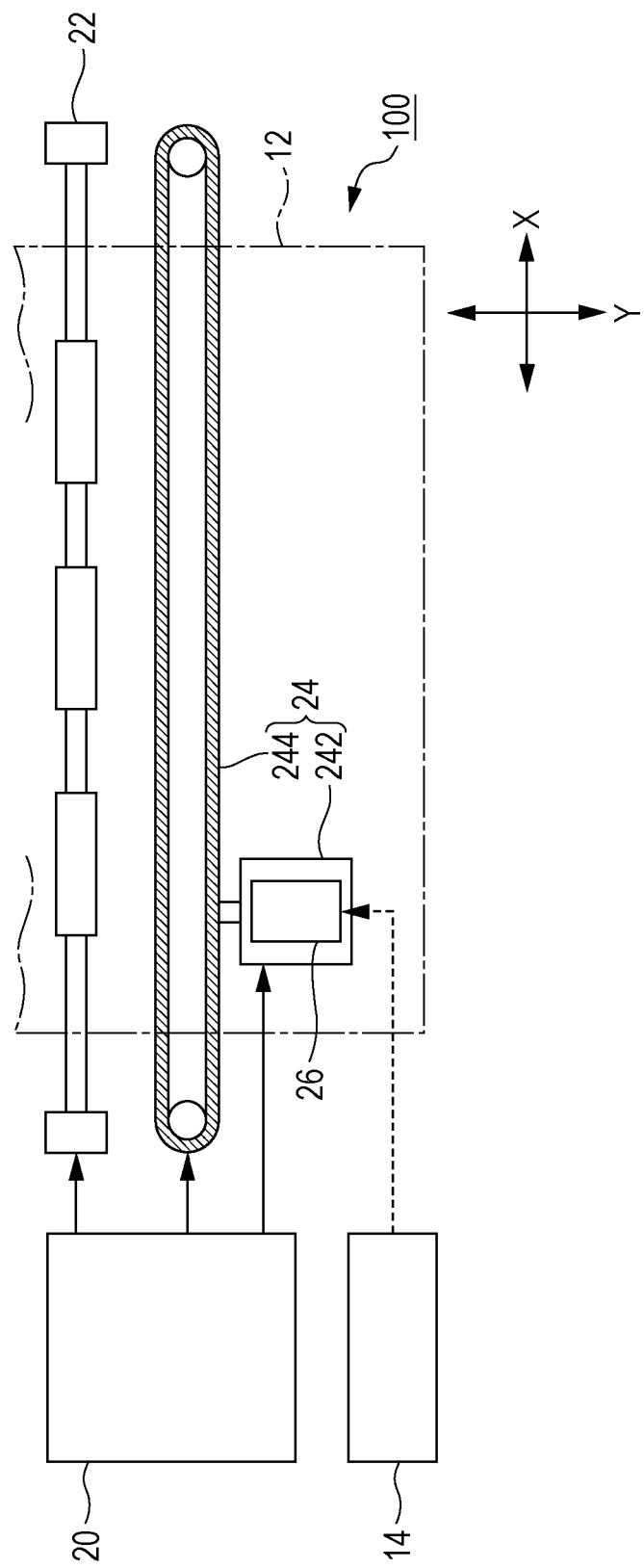
FIG. 1 is a schematic view illustrating a configuration of a liquid ejecting apparatus according to a first embodiment.

FIG. 1 is a schematic view illustrating a liquid ejecting apparatus 100 according to a first embodiment. The liquid ejecting apparatus 100 according to the first embodiment is an ink jet printing apparatus that ejects ink, which is an example of a liquid, onto a medium 12. Although the medium 12 is typically a printing paper sheet, a printing target made of any material such as a resin film and a fabric is used as the medium 12. As illustrated in FIG. 1, the liquid ejecting apparatus 100 is provided with a liquid container 14 that stores the ink. For example, a cartridge which can be attached to and detached from the liquid ejecting apparatus 100, a bag-like ink pack formed of a flexible film, or an ink tank which can be refilled with the ink is used as the liquid container 14.

As illustrated in FIG. 1, the liquid ejecting apparatus 100 includes a control unit 20, a transport mechanism 22, a movement mechanism 24, and a liquid ejecting head 26. The control unit 20 includes a processing circuit such as a central processing unit (CPU) and a field programmable gate array (FPGA) and a storage circuit such as a semiconductor memory, and integrally controls each component of the liquid ejecting apparatus 100. The control unit 20 is an example of a controller. The transport mechanism 22 transports the medium 12 along a Y axis under a control of the control unit 20.

The movement mechanism 24 causes the liquid ejecting head 26 to reciprocate along an X axis under the control of the control unit 20. The X axis intersects the Y axis along which the medium 12 is transported. For example, the X axis and the Y axis are perpendicular to each other. The movement mechanism 24 of the first embodiment includes a substantially box-shaped transport body 242 that accommodates the liquid ejecting head 26 and a transport belt 244 to which the transport body 242 is fixed. A configuration in which a plurality of the liquid ejecting heads 26 are mounted on the transport body 242 and a configuration in which the liquid container 14 together with the liquid ejecting head 26 is mounted on the transport body 242 may be adopted.

The liquid ejecting head 26 ejects the ink supplied from the liquid container 14 to the medium 12 from a plurality of nozzles under the control of the control unit 20. The liquid ejecting head 26 ejects the ink to the medium 12 together with the transportation of the medium 12 by the transport mechanism 22 and the repeated reciprocation of the transport body 242, so that an image is formed on the surface of the medium 12.

Figure 2:
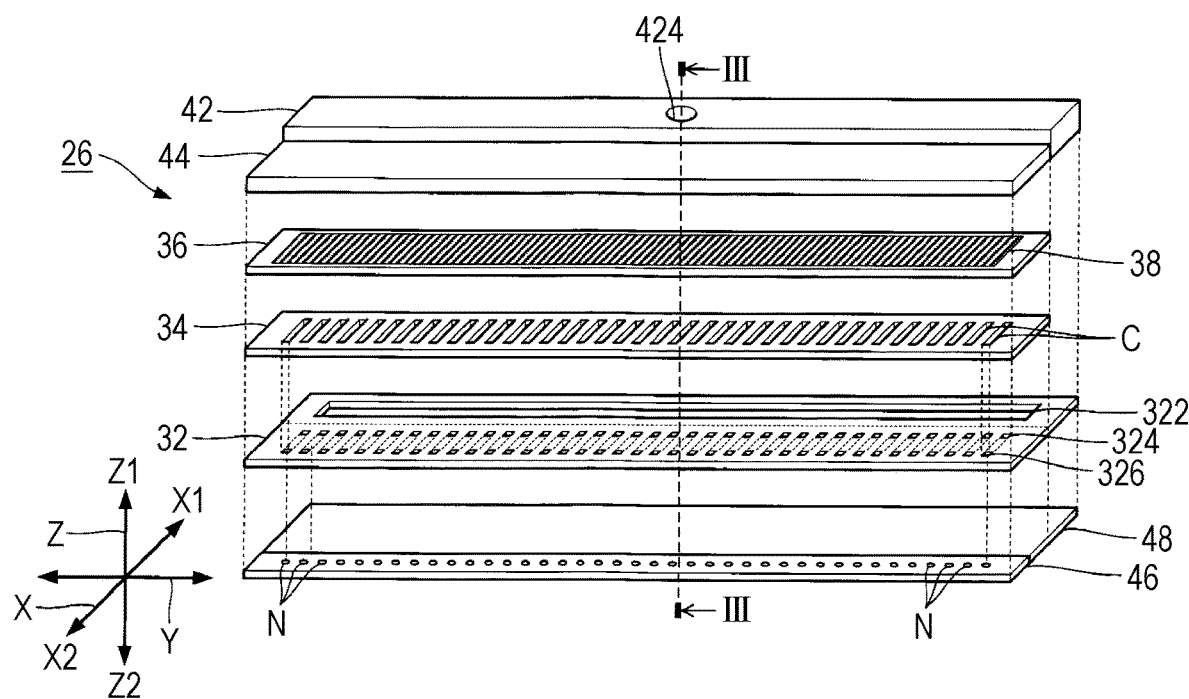
FIG. 2 is an exploded perspective view of a liquid ejecting head.
Figure 3:
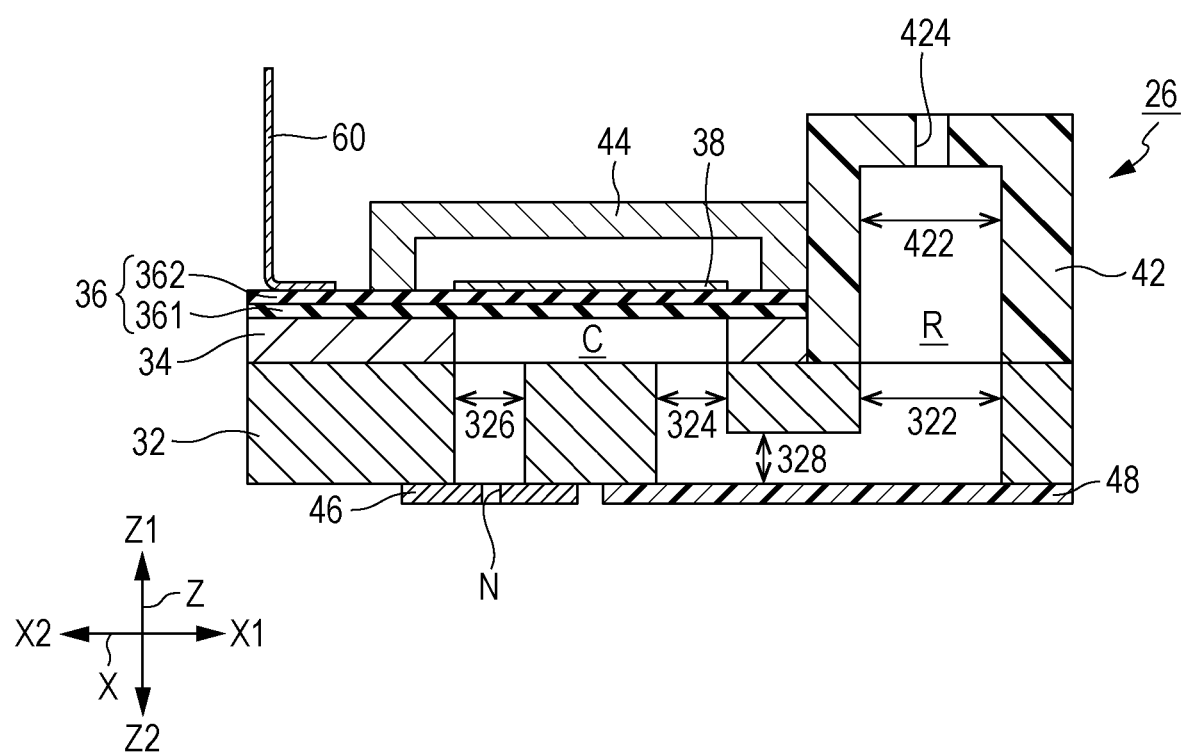
FIG. 3 is a sectional view taken along line III-III of FIG. 2.

FIG. 2 is an exploded perspective view of the liquid ejecting head 26, and FIG. 3 is a sectional view taken along line III-III in FIG. 2. As illustrated in FIG. 2, a Z axis perpendicular to the X-Y plane is assumed. The cross section illustrated in FIG. 3 is a cross section that is parallel to the X-Z plane. The Z axis is an axis along an ink ejection direction of the liquid ejecting head 26. As illustrated in FIG. 2, one side along the Z axis when viewed from a certain point is expressed as a "Z1 side", and the opposite side is expressed as a "Z2 side". Similarly, when viewed from a certain point, one side along the X axis is expressed as an "X1 side", and the opposite side is expressed as an "X2 side".

As illustrated in FIGS. 2 and 3, the liquid ejecting head 26 includes a substantially rectangular flow channel substrate 32 that is long along the Y axis. A pressure chamber substrate 34, a diaphragm 36, a plurality of piezoelectric elements 38, a housing portion 42, and a sealing body 44 are installed on the surface of the flow channel substrate 32 on the Z1 side. A nozzle plate 46 and a vibration absorber 48 are installed on the surface of the flow channel substrate 32 on the Z2 side. Components of the liquid ejecting head 26 are schematically a plate-like member that is long along the Y axis, which is like the flow channel substrate 32, and are bonded to each other using, for example, an adhesive. A combination of the diaphragm 36 and the piezoelectric element 38 corresponds to a "piezoelectric device". A combination of the pressure chamber substrate 34, the diaphragm 36, and the piezoelectric element 38 may be expressed as a "piezoelectric device".

As illustrated in FIG. 2, the nozzle plate 46 is a plate-like member on which a plurality of nozzles N arranged along the Y axis are formed. Each nozzle N is a through-hole through which ink passes. The flow channel substrate 32, the pressure chamber substrate 34, and the nozzle plate 46 are formed by processing, for example, a single crystal substrate of silicon (Si) by a semiconductor manufacturing technique such as etching. However, each component of the liquid ejecting head 26 may be made from any material in any manufacturing method. The direction of the Y axis may be referred to as a direction in which a plurality of nozzles N are arranged.

The flow channel substrate 32 is a plate-like member for forming a flow channel of the ink. As illustrated in FIGS. 2 and 3, the flow channel substrate 32 is formed with an opening portion 322, a supply flow channel 324, and a communication flow channel 326. The opening portion 322 is a through-hole that is continuous across the plurality of nozzles N along the Y axis in plan view from a Z axis direction. The supply flow channel 324 and the communication flow channel 326 are through-holes formed individually for each nozzle N. Further, as illustrated in FIG. 3, a relay flow channel 328 extending over the plurality of supply flow channels 324 is formed on the surface of the flow channel substrate 32 on the Z2 side. The relay flow channel 328 is a flow channel that causes the opening portion 322 and the plurality of supply flow channels 324 to communicate with each other.

The housing portion 42 is a structure manufactured by, for example, injection molding of a resin material, and is fixed to the surface of the flow channel substrate 32 on the Z1 side. As illustrated in FIG. 3, the housing portion 42 is formed with an accommodation portion 422 and an inlet 424. The accommodation portion 422 is a concave portion having an outer shape corresponding to the opening portion 322 of the flow channel substrate 32. The inlet 424 is a through-hole that communicates with the accommodation portion 422. As understood from FIG. 3, a space, which causes the opening portion 322 of the flow channel substrate 32 and the accommodation portion 422 of the housing portion 42 to communicate with each other, functions as a liquid storage chamber (a reservoir) R. The ink supplied from the liquid container 14 and passing through the inlet 424 is stored in the liquid storage chamber R.

The vibration absorber 48 absorbs pressure fluctuations in the liquid storage chamber R. The vibration absorber 48 includes, for example, a flexible sheet member that can be elastically deformed. In detail, the vibration absorber 48 is provided on the surface of the flow channel substrate 32 on the Z2 side such that the opening portion 322, the relay flow channel 328, and the plurality of supply flow channels 324 of the flow channel substrate 32 are blocked to configure the bottom surface of the liquid storage chamber R.

As illustrated in FIGS. 2 and 3, the pressure chamber substrate 34 is a plate-like member in which a plurality of pressure chambers C corresponding to the plurality of nozzles N, respectively, are formed. The plurality of pressure chambers C are arranged along the Y axis at intervals. Each pressure chamber C is a long opening along the X axis. An end portion of the pressure chamber C on the X1 side overlaps one supply flow channel 324 in plan view, and an end portion of the pressure chamber C on the X2 side overlaps one communication flow channel 326 of the flow channel substrate 32 in plan view.

The diaphragm 36 is installed on an opposite surface to the surface of the pressure chamber substrate 34 facing the flow channel substrate 32. The diaphragm 36 is a plate-like member that can be elastically deformed. As illustrated in FIG. 3, the diaphragm 36 of the first embodiment is configured by laminating an elastic film 361 and an insulating film 362. The insulating film 362 is located at an opposite side of the elastic film 361 from the pressure chamber substrate 34. The elastic film 361 is made of, for example, silicon dioxide ($SiO_2$). The insulating film 362 is made of, for example, zirconium dioxide ($ZrO_2$).

As understood from FIG. 3, the flow channel substrate 32 and the diaphragm 36 face each other with an interval inside the pressure chamber C. The pressure chamber C is a space that is located between the flow channel substrate 32 and the diaphragm 36 and applies a pressure to the ink filled in the pressure chamber C. The diaphragm 36 constitutes a part of the wall surface of the pressure chamber C. The ink stored in the liquid storage chamber R branches from the relay flow channel 328 to the supply flow channel 324 and is supplied to and filled in the plurality of pressure chambers C in parallel. That is, the liquid storage chamber R functions as a common liquid chamber for supplying the ink to the plurality of pressure chambers C.

As illustrated in FIGS. 2 and 3, the plurality of piezoelectric elements 38 corresponding to the plurality of nozzles N, respectively, are installed on the surface of the diaphragm 36 opposite to the pressure chamber substrate 34. The piezoelectric element 38 is a piezoelectric actuator that is deformed by supply of a drive signal, and is formed in a long shape along the X axis. The plurality of piezoelectric elements 38 are arranged along the Y axis to correspond to the plurality of pressure chambers C, respectively. When the diaphragm 36 vibrates in conjunction with the deformation of the piezoelectric elements 38, the pressure in the pressure chamber C fluctuates, so that the ink filled in the pressure chamber C passes through the communication flow channel 326 and the nozzle N and is ejected. That is, the piezoelectric element 38 is a drive element that ejects the ink in the pressure chamber C from the nozzle N by vibrating the diaphragm 36.

The sealing body 44 of FIGS. 2 and 3 is a structure that protects the plurality of piezoelectric elements 38 from the outside air and reinforces mechanical strengths of the pressure chamber substrate 34 and the diaphragm 36. The sealing body 44 is fixed to the surface of the diaphragm 36 with, for example, an adhesive. The plurality of piezoelectric elements 38 are accommodated inside a concave portion formed on the surface of the sealing body 44 facing the diaphragm 36.

As illustrated in FIG. 3, a wiring board 60 is bonded to the surface of the diaphragm 36. The wiring board 60 is a mounting component on which a plurality of wiring lines (not illustrated) for electrically coupling the control unit 20 and the liquid ejecting head 26 are formed. For example, the flexible wiring board 60 such as a flexible printed circuit (FPC) and a flexible flat cable (FFC) is suitably adopted.

Figure 4:
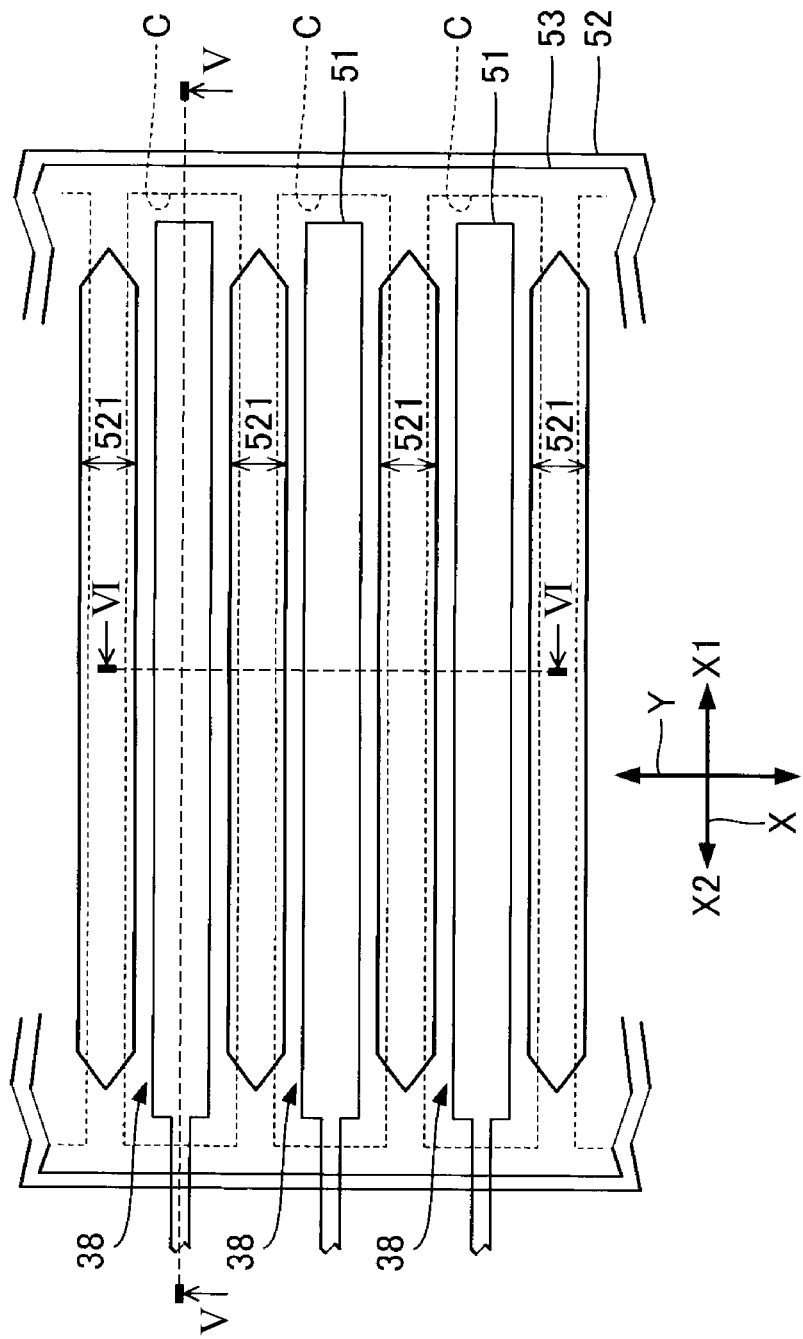
FIG. 4 is an enlarged plan view of a piezoelectric element.

A detailed configuration of the piezoelectric element 38 will be described in detail below. FIG. 4 is an enlarged plan view of the vicinity of the piezoelectric element 38. In FIG. 4, the outline of a component located on the rear side of a certain component is also illustrated by a solid line for convenience. Further, FIG. 5 is a sectional view taken along line V-V of FIG. 4, and FIG. 6 is a sectional view taken along line VI-VI of FIG. 4.

Figure 5:
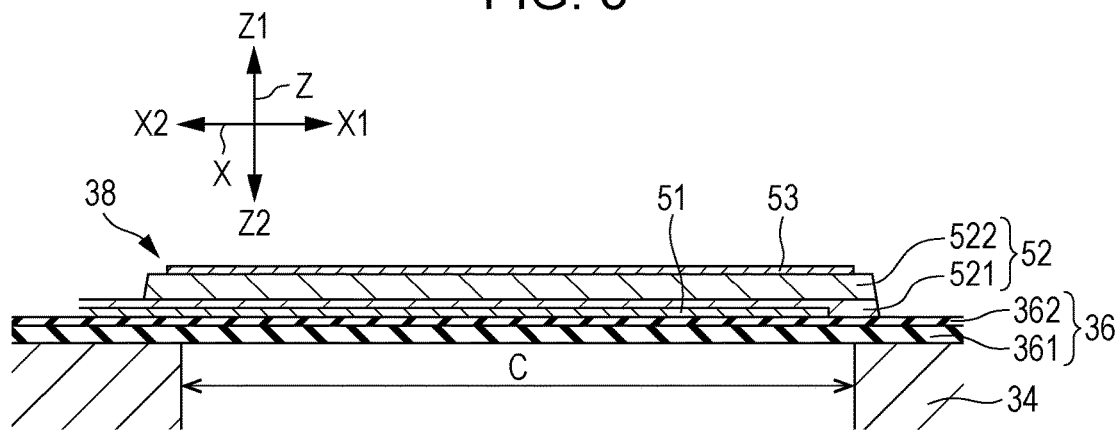
FIG. 5 is a sectional view taken along line V-V of FIG. 4.
Figure 6:
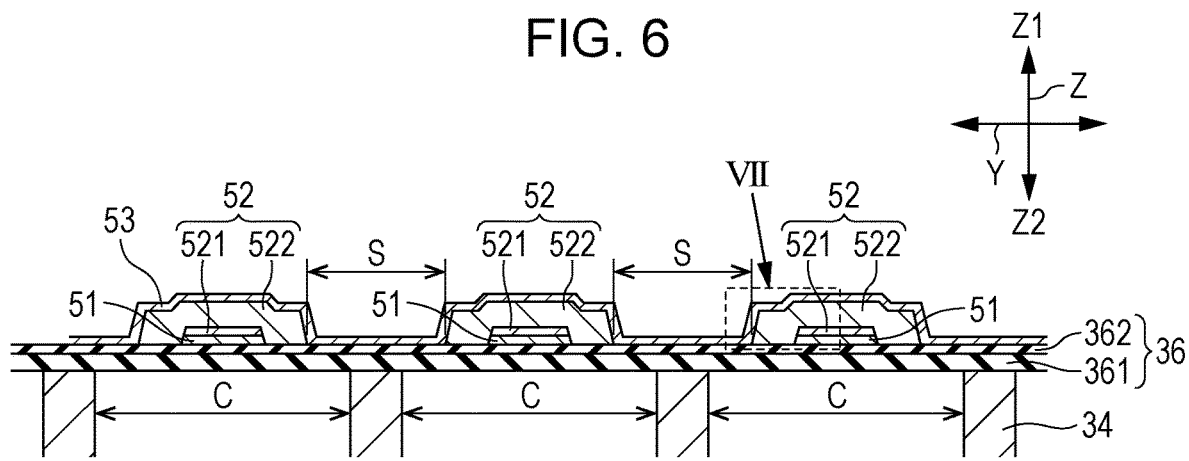
FIG. 6 is a sectional view taken along line VI-VI of FIG. 4.

As illustrated in FIGS. 4 to 6, the piezoelectric element 38 is schematically a structure in which a first electrode 51, a piezoelectric layer 52, and a second electrode 53 are laminated from the diaphragm 36 side in this order in the Z axis direction. In the present specification, the expression "a component A and a component B are laminated" is not limited to a configuration in which the component A and the component B are in direct contact with each other. That is, when the component A and the component B partially or entirely overlap each other in plan view, even a configuration in which another component C is interposed between the component A and the component B is included in a concept that "the component A and the component B are laminated". Further, likewise, the expression "a component B is formed on the surface of a component A" is not limited to a configuration in which the component A and the component B are in direct contact with each other. That is, even a configuration in which a component C is formed on the surface of the component A and the component B is formed on the surface of the component C is included in a concept that "the component B is formed on the surface of the component A" if the component A and the component B partially or entirely overlap each other in plan view. The direction of the Z axis corresponds to a direction in which the first electrode 51, the piezoelectric layer 52, and the second electrode 53 are laminated.

As illustrated in FIGS. 4 to 6, the first electrode 51 is formed on the surface of the diaphragm 36. The first electrodes 51 are individual electrodes formed to be separated from each other for each piezoelectric element 38. In detail, the plurality of first electrodes 51 that are long along the X axis are arranged at intervals in the Y axis direction. The first electrode 51 is formed of a conductive material having high heat resistance and low resistance such as platinum (Pt) and iridium (Ir). A drive signal is supplied to a connection terminal formed at an end portion on the X2 side of the first electrode 51 via the wiring board 60.

The piezoelectric layer 52 is formed on the surface of the diaphragm 36 on which the first electrode 51 is formed. The piezoelectric layer 52 is a band-shaped dielectric film that is continuous along the Y axis across the plurality of piezoelectric elements 38. The piezoelectric layer 52 is formed of, for example, a piezoelectric material such as lead zirconate titanate ($Pb(Zr,Ti)O_3$). As illustrated in FIG. 6, a notch S along the X axis is formed in a region of the piezoelectric layer 52 corresponding to a gap between the pressure chambers C adjacent to each other. The notch S is an opening that penetrates the piezoelectric layer 52. According to the above-described configuration, the piezoelectric element 38 is individually deformed for the pressure chamber C, and the propagation of vibration between the piezoelectric elements 38 is suppressed.

As illustrated in FIGS. 5 and 6, the piezoelectric layer 52 is configured by laminating a first layer 521 and a second layer 522. The first layer 521 and the second layer 522 are, for example, dielectric layers formed of a common dielectric material. The first layer 521 covers the first electrode 51. In detail, the first layer 521 is formed in the same planar shape as the first electrode 51 and overlaps the entire area of the first electrode 51 in plan view. The second layer 522 covers the surface and the side surfaces of the first layer 521.

Figure 7:
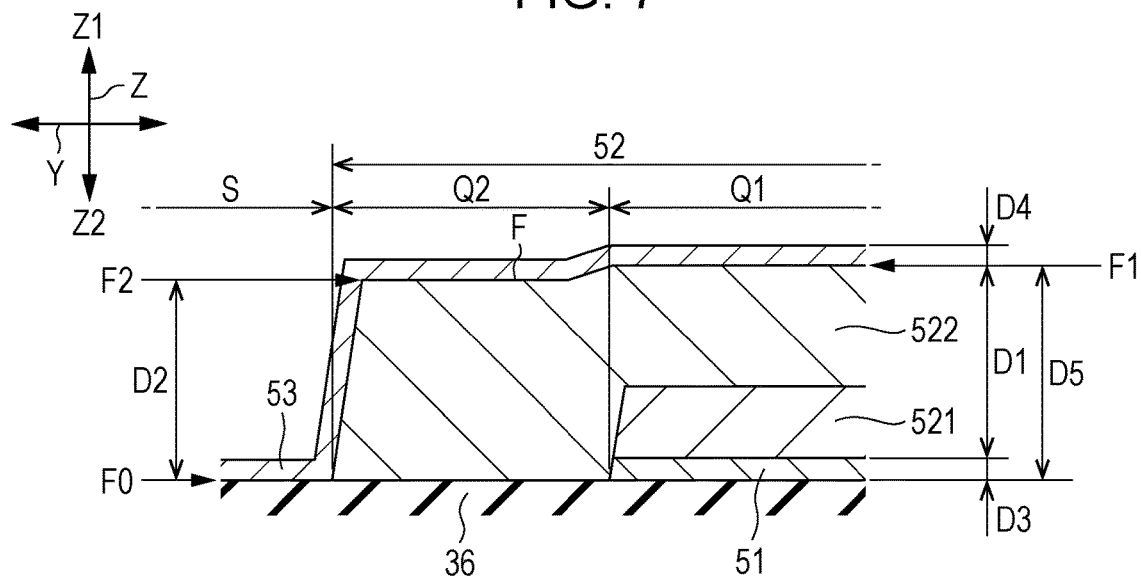
FIG. 7 is an enlarged sectional view of a range VII of FIG. 6.

FIG. 7 is an enlarged sectional view of a range VII of FIG. 6. As illustrated in FIG. 7, the second layer 522 of the piezoelectric layer 52 includes a portion that overlaps the first electrode 51 in plan view and a portion that does not overlap the first electrode 51 in plan view, in a cross-section perpendicular to the X axis. As understood from the above description, the piezoelectric layer 52 includes a first portion Q1 that overlaps the first electrode 51 in plan view and second portions Q2 that do not overlap the first electrode 51 in plan view. The second portions Q2 are formed on both sides of the first portion Q1 in the Y direction. The first portion Q1 is configured by laminating the first layer 521 and the second layer 522, and the second portions Q2 are configured with a single layer of the second layer 522.

As illustrated in FIGS. 4 to 6, the second electrode 53 covers the piezoelectric layer 52. The second electrode 53 of the first embodiment is a band-shaped common electrode that is continuous along the Y axis across the plurality of piezoelectric elements 38. A predetermined constant voltage is applied to the second electrode 53. The second electrode 53 is formed of, for example, a low-resistance conductive material such as platinum (Pt) and iridium (Ir). As illustrated in FIG. 7, the second electrode 53 is in contact with a surface F at an opposite side of the piezoelectric layer 52 from the diaphragm 36, an inner wall surface of the notch S, and an area of the surface of the diaphragm 36, exposed to the inside of the notch S.

As illustrated in FIG. 7, a film thickness (hereinafter, referred to as a "fourth film thickness") D4 of the second electrode 53 is larger than a film thickness (hereinafter, referred to as a "third film thickness") D3 of the first electrode 51. According to the above-described configuration, the piezoelectric layer 52 can be effectively protected by the second electrode 53. That is, for example, the second electrode 53 functions as a protective layer that prevents adhesion of outside air or moisture to the piezoelectric layer 52.

As understood from FIGS. 6 and 7, the first portion Q1 of the piezoelectric layer 52 is located between the first electrode 51 and the second electrode 53. Therefore, the first portion Q1 is an active portion that is deformed in accordance with a voltage between the first electrode 51 and the second electrode 53. On the other hand, the second portion Q2 of the piezoelectric layer 52 overlaps the second electrode 53 in plan view but does not overlap the first electrode 51 in plan view. Therefore, the second portion Q2 is an inactive portion that is less deformed than the first portion Q1. Actually, the second portion Q2 is not mostly deformed. In the above-described configuration, a stress is concentrated near a boundary between the first portion Q1 and the second portion Q2 in the piezoelectric layer 52.

As illustrated in FIG. 7, the surface F at an opposite side of the piezoelectric layer 52 from the diaphragm 36 includes a first surface F1 and a second surface F2. The first surface F1 is a surface at an opposite side of the first portion Q1 from the diaphragm 36. The second surface F2 is a surface at an opposite side of the second portion Q2 from the diaphragm 36. The second electrode 53 covers the entire surface F of the piezoelectric layer 52 including the first surface F1 and the second surface F2.

The positions of the first surface F1 and the second surface F2 in the Z direction are different from each other. In detail, the second surface F2 is closer to the diaphragm 36 than is the first surface F1. That is, the second surface F2 is in a recessed position with respect to the first surface F1. Therefore, a step between the first surface F1 and the second surface F2 is formed on the surface F of the piezoelectric layer 52. The step between the first surface F1 and the second surface F2 is a step on which the third film thickness D3 of the first electrode 51 is reflected. The above-described step of the surface F is simply formed by a sol-gel method in which the piezoelectric layer 52 is formed by applying a sol of a piezoelectric material and heating and drying the piezoelectric material. The viscosity of the sol of the piezoelectric material is set to a proper value such that a step is formed between the first surface F1 and the second surface F2.

A first film thickness D1 of FIG. 7 is a film thickness of the first portion Q1 of the piezoelectric layer 52. In detail, a distance between the surface at an opposite side of the first electrode 51 from the diaphragm 36 and the first surface F1 of the piezoelectric layer 52 is the first film thickness D1. That is, the first film thickness D1 is a sum of the film thickness of the first layer 521 of the piezoelectric layer 52 and the film thickness of a portion of the second layer 522 laminated on the first layer 521.

A second film thickness D2 of FIG. 7 is a film thickness of the second portion Q2 of the piezoelectric layer 52. In detail, a distance between a surface (hereinafter, referred to as an "element formation surface") F0 of the diaphragm 36 on which the piezoelectric element 38 is formed and the second surface F2 of the piezoelectric layer 52 is the second film thickness D2. The element formation surface F0 is a surface at an opposite side of the diaphragm 36 from the pressure chamber C and is expressed as an interface between the insulating film 362 of the diaphragm 36 and the second portion Q2 of the piezoelectric layer 52.

A fifth film thickness D5 of FIG. 7 is a sum of the first film thickness D1 of the first portion Q1 of the piezoelectric layer 52 and the third film thickness D3 of the first electrode 51 (D5=D1+D3). The fifth film thickness D5 corresponds to a distance between the element formation surface F0 of the diaphragm 36 and the first surface F1 of the piezoelectric layer 52.

As illustrated in FIG. 7, the second film thickness D2 of the second portion Q2 of the piezoelectric layer 52 is larger than the first film thickness D1 of the first portion Q1 (D2>D1). Further, the second film thickness D2 of the second portion Q2 is smaller than the fifth film thickness D5 that is a sum of the first film thickness D1 and the third film thickness D3 (D2<D1+D3=D5).

As described above, a stress is concentrated near the boundary between the first portion Q1 and the second portion Q2. In the first embodiment, the second film thickness D2 of the second portion Q2 is larger than the first film thickness D1 of the first portion Q1. Therefore, as compared to a configuration in which the second film thickness D2 is smaller than the first film thickness D1, a possibility that the second portion Q2 is damaged due to deformation of the first portion Q1 can be reduced.

A configuration in which the second film thickness D2 is sufficiently large is preferable from the viewpoint of reducing the possibility of breakage of the second portion Q2. However, in a configuration in which the second film thickness D2 is excessively large, there is a possibility that appropriate vibration characteristics cannot be realized for the piezoelectric element 38. In the first embodiment, the second film thickness D2 of the second portion Q2 is limited to a range that is smaller than the fifth film thickness D5 that is a sum of the first film thickness D1 of the first portion Q1 and the third film thickness D3 of the first electrode 51. Therefore, it is possible to realize suitable vibration characteristics of the piezoelectric element 38.

Second Embodiment

A second embodiment will be described. In the following examples, a component having the same function as that of the first embodiment is designated by the same reference numeral used in the description of the first embodiment, and detailed description thereof will be omitted as appropriate.

Figure 8:
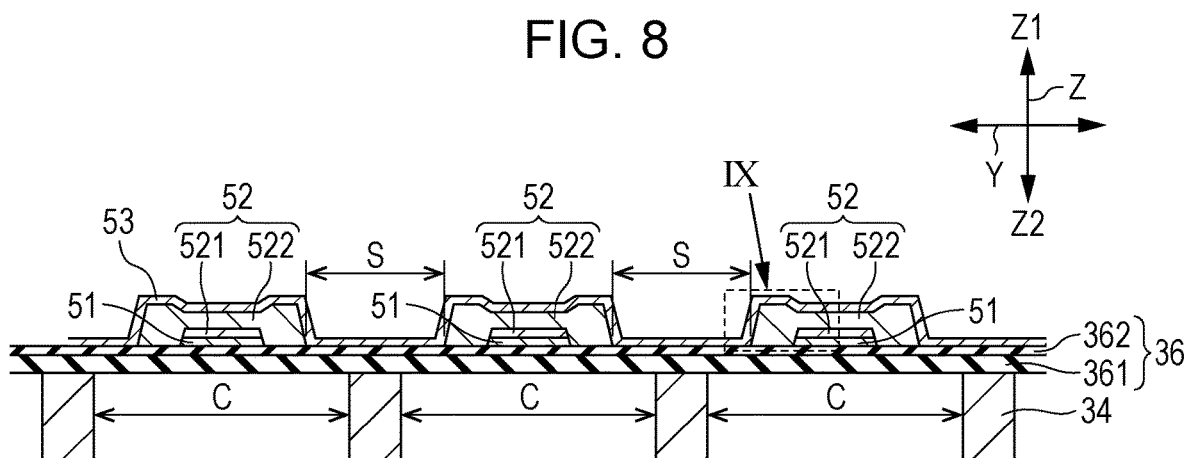
FIG. 8 is a sectional view of a piezoelectric element according to a second embodiment.
Figure 9:
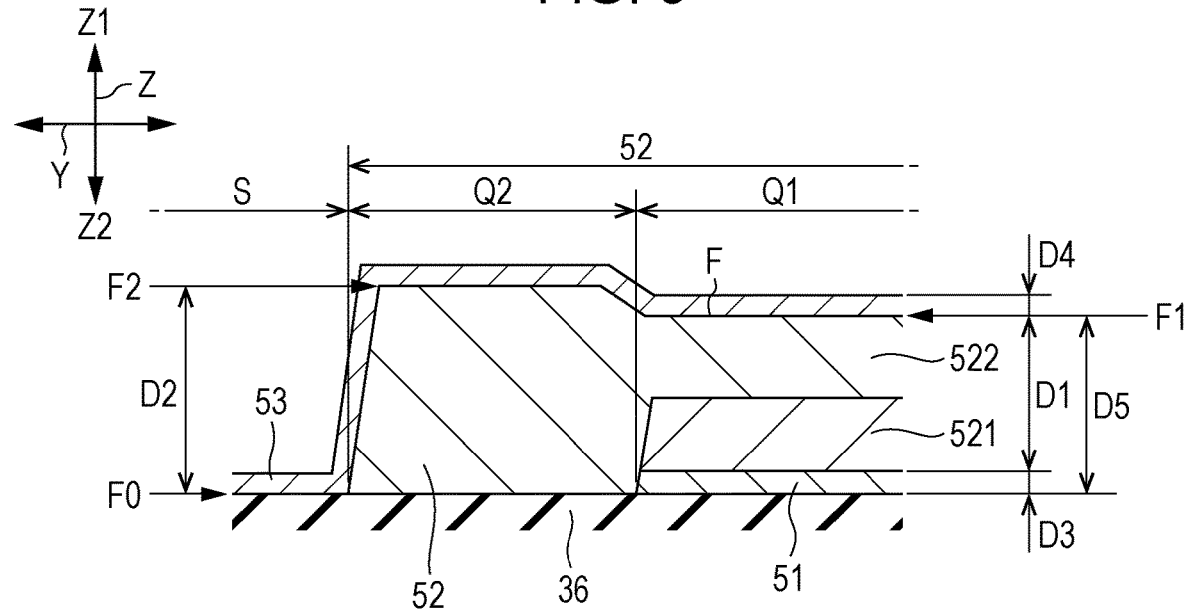
FIG. 9 is an enlarged sectional view of a range IX of FIG. 8.

FIG. 8 is a sectional view of the piezoelectric element 38 according to the second embodiment, and FIG. 9 is an enlarged sectional view of a range IX of FIG. 8. Similar to FIG. 6, FIG. 8 illustrates a cross-section that is perpendicular to the X axis. As illustrated in FIGS. 8 and 9, the piezoelectric layer 52 of the second embodiment includes the first portion Q1 and the second portion Q2. Similar to the first embodiment, the first portion Q1 is a portion located between the first electrode 51 and the second electrode 53 in the piezoelectric layer 52, and the second portion Q2 is a portion that overlaps the second electrode 53 in plan view but does not overlap the first electrode 51 in plan view.

A configuration (D2>D1) in which in the piezoelectric layer 52, the second film thickness D2 of the second portion Q2 is larger than the first film thickness D1 of the first portion Q1 is the same as that of the first embodiment. Therefore, according to the second embodiment, similar to the first embodiment, as compared to a configuration in which the second film thickness D2 is smaller than the first film thickness D1, a possibility that the second portion Q2 is damaged due to the deformation of the first portion Q1 can be reduced. The configuration in which the fourth film thickness D4 of the second electrode 53 is larger than the third film thickness D3 of the first electrode 51 is also the same as that of the first embodiment.

In the first embodiment, the configuration in which the second surface F2 of the second portion Q2 is closer to the diaphragm 36 than the first surface F1 of the first portion Q1 is exemplified. In contrast to the first embodiment, in the second embodiment, as illustrated in FIGS. 8 and 9, the first surface F1 of the first portion Q1 is closer to the diaphragm 36 than the second surface F2 of the second portion Q2. That is, the first surface F1 is in a recessed position with respect to the second surface F2. The entire first surface F1 overlaps the first electrode 51 in plan view. Therefore, a planar recess corresponding to the first electrode 51 is formed on the surface F of the piezoelectric layer 52. That is, a step between the first surface F1 and the second surface F2 is formed on the surface F of the piezoelectric layer 52. The above-described step of the surface F is formed by removing, for example, only a part of an area of the piezoelectric layer formed of a piezoelectric material and having a predetermined thickness in a film thickness direction, the area corresponding to the first surface F1. Wet etching or dry etching is preferably adopted for the selective removal of the piezoelectric layer.

As can be understood from the above description, in the second embodiment, the fifth film thickness D5 that is a sum of the first film thickness D1 of the first portion Q1 and the third film thickness D3 of the first electrode 51 is smaller than the second film thickness D2 (D5=D1+D3<D2). According to the above configuration, the first film thickness D1 of the first portion Q1 is reduced as compared with the first embodiment. Therefore, there is an advantage in that it is easy to ensure the deformation amount of the first portion Q1. According to the first embodiment, since it is not necessary to remove a region of the piezoelectric layer corresponding to the first surface F1, there is an advantage in that a process of manufacturing the piezoelectric element 38 is simplified as compared to the second embodiment.

Third Embodiment

Figure 10:
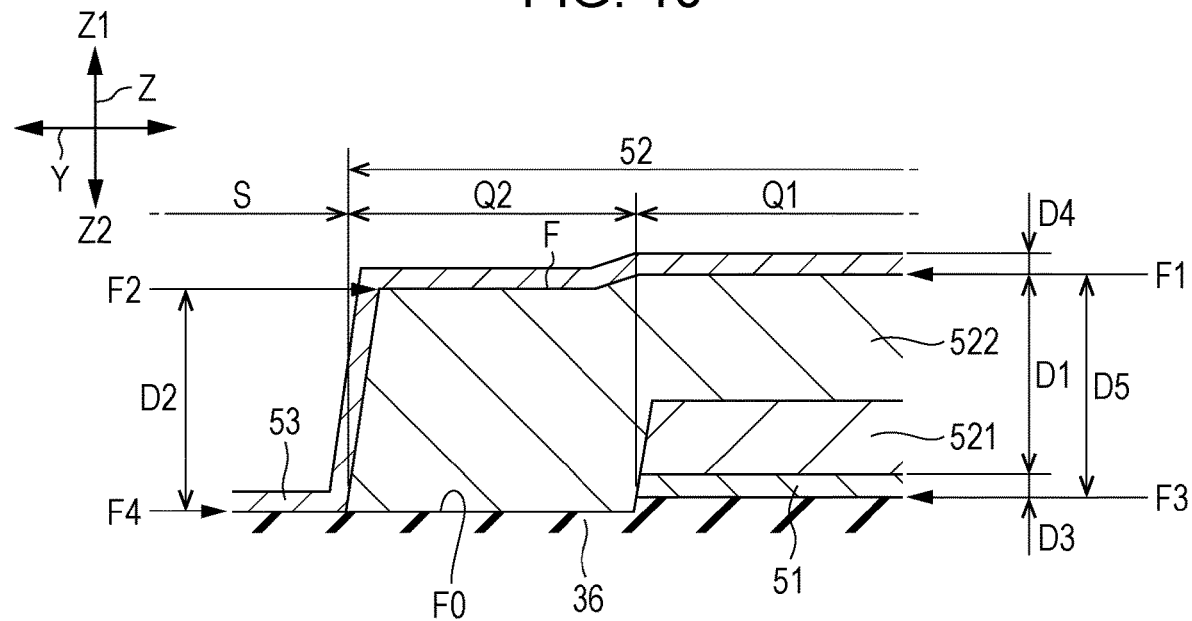
FIG. 10 is an enlarged sectional view of a piezoelectric element according to a third embodiment.

FIG. 10 is an enlarged sectional view of the piezoelectric element 38 according to a third embodiment. FIG. 10 illustrates a cross section corresponding to FIGS. 7 and 9. As illustrated in FIG. 10, the element formation surface F0 of the diaphragm 36 according to the third embodiment includes a third surface F3 and a fourth surface F4. The fourth surface F4 is a surface recessed with respect to the third surface F3. That is, the fourth surface F4 is located closer to the pressure chamber C than the third surface F3.

In detail, in a process of selectively removing a laminate of a conductive film that is the first electrode 51 and a piezoelectric layer that is the first layer 521 of the piezoelectric layer 52, for example, by etching, the fourth surface F4 is formed by removing a part of the insulating film 362 of the diaphragm 36 in a film thickness direction. That is, a step between the third surface F3 and the fourth surface F4 is formed by overetching in a process of forming the first electrode 51 and the first layer 521. Therefore, the first electrode 51 and the first portion Q1 of the piezoelectric layer 52 are formed on the third surface F3. On the other hand, the second portion Q2 of the piezoelectric layer 52 is formed on the fourth surface F4.

Even in the third embodiment, similar to the first embodiment, the second film thickness D2 of the second portion Q2 of the piezoelectric layer 52 is larger than the first film thickness D1 of the first portion Q1 (D2>D1). Further, in the third embodiment, the second portion Q2 is formed on the fourth surface F4 recessed with respect to the third surface F3 on which the first portion Q1 is formed. Therefore, as compared to the configuration of the first embodiment in which the first portion Q1 and the second portion Q2 are formed on the element formation surface F0 that is a planar surface not having the step, there is an advantage in that it is easy to ensure the second film thickness D2 of the second portion Q2. Further, as the fourth surface F4 is formed on the diaphragm 36, there is also an advantage in that the piezoelectric layer 52 is easily in close contact with the element formation surface F0.

In FIG. 10, a configuration is illustrated in which the second surface F2 is closer to the diaphragm 36 than the first surface F1. However, in a configuration in which the first surface F1 is closer to the diaphragm 36 than the second surface F2 as in the second embodiment, a configuration of the third embodiment may be adopted in which the element formation surface F0 includes the third surface F3 and the fourth surface F4.

Modification

Each embodiment illustrated above can be variously modified. Detailed modifications that can be applied to the above-described embodiments will be described as an example below. Two or more aspects selected from the following examples in a predetermined manner can be appropriately combined as long as the aspects do not contradict each other.

(1) In the above-described embodiments, the first electrode 51 of the piezoelectric element 38 is set as an individual electrode and the second electrode 53 is set as a common electrode. However, the first electrode 51 may be set as a common electrode and the second electrode 53 may be set as an individual electrode. In the configuration in which the second electrode 53 is set as an individual electrode, the second portion Q2 of the piezoelectric layer 52 overlaps the first electrode 51 in plan view and does not overlap the second electrode 53 in plan view. Further, both the first electrode 51 and the second electrode 53 may be individual electrodes. In the configuration in which both the first electrode 51 and the second electrode 53 are individual electrodes, the second portion Q2 of the piezoelectric layer 52 overlaps neither the first electrode 51 nor the second electrode 53 in plan view. As understood from the above description, the second portion Q2 of the piezoelectric layer 52 does not overlap at least one of the first electrode 51 and the second electrode 53 in plan view.

(2) In the above-described embodiments, the piezoelectric layer 52 is configured by a laminate of the first layer 521 and the second layer 522. However, the piezoelectric layer 52 may be formed by a single layer. Further, the piezoelectric layer 52 may be formed by laminating three or more layers made of a piezoelectric material.

(3) In the above-described embodiments, a serial type liquid ejecting apparatus 100 is illustrated which causes the transport body 242, on which the liquid ejecting head 26 is mounted, to reciprocate. However, the present disclosure can be applied to a line-type liquid ejecting apparatus in which the plurality of nozzles N are distributed over the entire width of the medium 12.

(4) The liquid ejecting apparatus 100 exemplified in the above-described embodiments may be adopted for various apparatuses such as a facsimile apparatus and a copying machine in addition to equipment dedicated to printing. However, usage of the liquid ejecting apparatus of the present disclosure is not limited to printing. For example, a liquid ejecting apparatus that ejects a solution of a color material is used as a manufacturing apparatus that forms a color filter of a display device such as a liquid crystal display panel. Further, a liquid ejecting apparatus that ejects a solution of a conductive material is used as a manufacturing apparatus that forms a wiring line and an electrode of a wiring board. Further, a liquid ejecting apparatus that ejects an organic solution related to a living body is used as, for example, a manufacturing apparatus that manufactures a biochip.

(5) The liquid ejecting head 26 exemplified in the above-described embodiments is an example of a piezoelectric device. As a piezoelectric device other than the liquid ejecting head 26, there is provided, for example,

[a] a correction actuator for correcting a focus shift of a lens due to shaking of an imaging apparatus such as a still camera and a video camera,

[b] an ultrasonic device such as an ultrasonic cleaner, an ultrasonic diagnostic device, a fish finder, an ultrasonic oscillator, and an ultrasonic motor,

[c] various filters such as a filter for blocking harmful rays such as infrared rays, an optical filter using a photonic crystal effect by quantum dot formation, and an optical filter using optical interference of a thin film, and

[d] various devices such as a temperature-electricity converter, a pressure-electricity converter, a ferroelectric transistor and a piezoelectric transformer.

Further, the present disclosure is also applied to a piezoelectric element used as a sensor or a piezoelectric element used as a ferroelectric memory. Examples of the sensor using the piezoelectric element include an infrared sensor, an ultrasonic sensor, a thermal sensor, a pressure sensor, a pyroelectric sensor, an angular velocity sensor, and the like.

What is claimed is:

1. A liquid ejecting head comprising:
a diaphragm that constitutes a part of a wall surface of a pressure chamber in which a liquid is filled; and
a piezoelectric element that vibrates the diaphragm,
the piezoelectric element includes
a first electrode, a second electrode, and a piezoelectric layer, wherein
a direction that the first electrode, the piezoelectric layer, and the second electrode are stacked is Z direction,
a direction that a plurality of pressure chambers are arranged is Y direction,
a direction orthogonally crossing to both the Z direction and Y direction is X direction,
a piezoelectric layer including, when viewed from the X direction, a first portion located between the first electrode and the second electrode and a second portion not overlapping at least one of the first electrode and the second electrode in plan view,
a first surface at an opposite side of the first portion from the diaphragm and a second surface at an opposite side of the second portion from the diaphragm are different in position in the Z direction, and
a second film thickness of the second portion is larger than a first film thickness of the first portion.

2. The liquid ejecting head according to claim 1, wherein the second film thickness is smaller than a sum of the first film thickness and a film thickness of the first electrode.

3. The liquid ejecting head according to claim 1, wherein a sum of the first film thickness and a film thickness of the first electrode is smaller than the second film thickness.

4. The liquid ejecting head according to claim 3, wherein all of the first surface overlap the first electrode in plan view.

5. The liquid ejecting head according to claim 1, wherein a surface of the diaphragm on which the piezoelectric element is formed includes a third surface and a fourth surface that is recessed with respect to the third surface,
the first electrode and the first portion are formed on the third surface, and
the second portion is formed on the fourth surface.

6. The liquid ejecting head according to claim 1, wherein a film thickness of the second electrode is larger than a film thickness of the first electrode.

7. A liquid ejecting apparatus comprising:
the liquid ejecting head according to claim 1; and
a controller that controls the liquid ejecting head.

8. A liquid ejecting head comprising:
a diaphragm that constitutes a part of a wall surface of a pressure chamber in which a liquid is filled; and
a piezoelectric element that vibrates the diaphragm, wherein
the piezoelectric element includes a first electrode and a second electrode, and
a piezoelectric layer including a first portion located between the first electrode and the second electrode and a second portion not overlapping at least one of the first electrode and the second electrode in plan view,
a first surface at an opposite side of the first portion from the diaphragm and a second surface at an opposite side of the second portion from the diaphragm are different in position in a laminate direction of the first electrode, the piezoelectric layer, and the second electrode, and
a second film thickness of the second portion is larger than a first film thickness of the first portion, and
the second film thickness is smaller than a sum of the first film thickness and a film thickness of the first electrode.

9. A liquid ejecting apparatus comprising:
the liquid ejecting head according to claim 8; and
a controller that controls the liquid ejecting head.

10. A liquid ejecting head comprising:
a diaphragm that constitutes a part of a wall surface of a pressure chamber in which a liquid is filled; and
a piezoelectric element that vibrates the diaphragm, wherein
the piezoelectric element includes
a first electrode and a second electrode, and
a piezoelectric layer including a first portion located between the first electrode and the second electrode and a second portion not overlapping at least one of the first electrode and the second electrode in plan view,
a first surface at an opposite side of the first portion from the diaphragm and a second surface at an opposite side of the second portion from the diaphragm are different in position in a laminate direction of the first electrode, the piezoelectric layer, and the second electrode, and
a second film thickness of the second portion is larger than a first film thickness of the first portion, and
a surface of the diaphragm on which the piezoelectric element is formed includes a third surface and a fourth surface that is recessed with respect to the third surface,
the first electrode and the first portion are formed on the third surface, and
the second portion is formed on the fourth surface.

11. A liquid ejecting apparatus comprising:
the liquid ejecting head according to claim 10; and
a controller that controls the liquid ejecting head.

12. A liquid ejecting head comprising:
a diaphragm that constitutes a part of a wall surface of a pressure chamber in which a liquid is filled; and
a piezoelectric element that vibrates the diaphragm, wherein
the piezoelectric element includes
a first electrode and a second electrode, and
a piezoelectric layer including a first portion located between the first electrode and the second electrode and a second portion not overlapping at least one of the first electrode and the second electrode in plan view,
a first surface at an opposite side of the first portion from the diaphragm and a second surface at an opposite side of the second portion from the diaphragm are different in position in a laminate direction of the first electrode, the piezoelectric layer, and the second electrode, and a second film thickness of the second portion is larger than a first film thickness of the first portion, and a film thickness of the second electrode is larger than a film thickness of the first electrode.

13. A liquid ejecting apparatus comprising:

the liquid ejecting head according to claim 12; and a controller that controls the liquid ejecting head.

* * * * *